United States Patent [19]

Castagnozzi

[11] Patent Number: 4,888,588
[45] Date of Patent: Dec. 19, 1989

[54] DIGITAL TRIGGER

[75] Inventor: Daniel M. Castagnozzi, Waltham, Mass.

[73] Assignee: Tektronix, Inc., Beaverton, Oreg.

[21] Appl. No.: 258,423

[22] Filed: Oct. 17, 1988

[51] Int. Cl.⁴ .............................................. H03M 1/12
[52] U.S. Cl. ..................................... 341/122; 341/155
[58] Field of Search ........................ 341/155, 122, 123

[56] References Cited

U.S. PATENT DOCUMENTS

| | | | |
|---|---|---|---|
| 4,578,667 | 3/1986 | Hollister | 341/122 |
| 4,656,598 | 4/1987 | Wilson | 341/122 |
| 4,755,951 | 7/1988 | Hollister | 341/122 |
| 4,768,017 | 8/1988 | Gordon | 341/122 |
| 4,791,404 | 12/1988 | Hollister | 341/122 |

OTHER PUBLICATIONS

Tektronix, "The XYZ's of Using a Scope", 1986, pp. 15-21, TEK Multipurpose Oscilloscopes.

Primary Examiner—William M. Shoop, Jr.
Assistant Examiner—Helen Kim
Attorney, Agent, or Firm—Mark L. Becker; Peter J. Meza

[57] ABSTRACT

A digital trigger for a digitizing instrument having multiple analog-to-digital converters employed in interleaved fashion and in which the clock phase and period of a trigger point can be accurately determined. The digital trigger includes a digital comparator for comparing the output signals of each analog-to-digital converter to a trigger threshold level to generate a trigger signal at the output of the comparator if a trigger point occurs on the output signal. The outputs of the collective digital comparators are routed to decoding logic which generates a digital signal that indicates the phase of the clock period in which the trigger point occurred. The outputs of collective digital comparators are also logically ORed together for detecting if a trigger point occurred during a clock period.

10 Claims, 2 Drawing Sheets 4,888,588

DIGITAL TRIGGER

BACKGROUND OF THE INVENTION

This invention generally relates to triggers for digitizing instruments and, more particularly, to a digital trigger for a digitizing instrument in which multiple analog-to-digital converters are employed to provide a higher sampling rate than is possible with a single analog-to-digital converter.

A digitizing instrument such as a digital oscilloscope or transient digitizer must have a sampling rate that is at least twice as fast as the analog signal being sampled in order to accurately determine the nature of the signal. This sampling is done by one or more analog-to-digital converters (ADCs). The rate at which a single converter can digitize an analog signal (known as conversion rate), however, may be too slow for fast signals such as those in the gigahertz range. To facilitate higher sampling rates, a digitizing instrument may employ a number of analog-to-digital converters to operate on successive samples of the signal in interleaved fashion. In this arrangement, a multiphase clock typically generates separate clock signals over a clock period. Each signal clocks a separate ADC during a different phase of the multiphase clock, effectively multiplying the sampling rate.

Prior triggers for digitizing instruments employing multiple, interleaved ADCs have been analog in nature, comparing the analog input signal directly to an analog trigger threshold level. While such triggers are adequate, they suffer from a number of drawbacks when used with digitizing instruments. Additional circuitry, with the attendant space, power, cost, and reliability is required. Moreover, the trigger point on the analog signal may not correspond to the trigger point on the equivalent digitized signal, causing the instrument to trigger at an undesired point.

As an alternative to an analog trigger, a digital trigger may be employed that compares the digitized output signal of each analog-to-digital converter against a digitized trigger threshold level. A digital trigger addresses the drawbacks of an analog trigger, but to date their use in interleaved systems has sacrificed trigger point resolution (accuracy) in return. It is difficult to tell when a trigger point on an input signal occurred in a clock period, because the digitized signals from each converter must be synchronized to a system clock before they can serve as a trigger. The clock period itself can still be identified by the presence of a trigger signal, but not the individual phase thereof.

SUMMARY OF THE INVENTION

An object of the invention, therefore, is to provide an digital trigger with improved trigger resolution for digitizing instruments that utilize the interleaving of multiple ADCs.

Another object of the invention is to provide such a digital trigger that indicates accurately the clock period as well as its phase in which a trigger point on an input signal occurred.

To achieve these objects, a digital trigger includes comparator means for comparing the digitized output signal of each analog-to-digital converter to a trigger threshold level and means for evaluating the output signals of the collective comparator means generated during the same clock period. From this evaluation, the phase of the clock period in which a trigger point occurred can be determined.

In the present embodiment, the evaluating means may comprise decoding logic coupled to the collective comparator means for generating a signal that indicates the phase.

The comparator means may comprise a trigger threshold level source and a digital comparator. The digital comparator compares the value of the trigger threshold level source against the digitized output signal and generates a trigger signal if the output signal exceeds the threshold value.

The foregoing and other objects, features, and advantages of the invention will become more apparent from the following detailed description of a preferred embodiment which proceeds with reference to the accompanying drawings.

DETAILED DESCRIPTION

Figure 1:
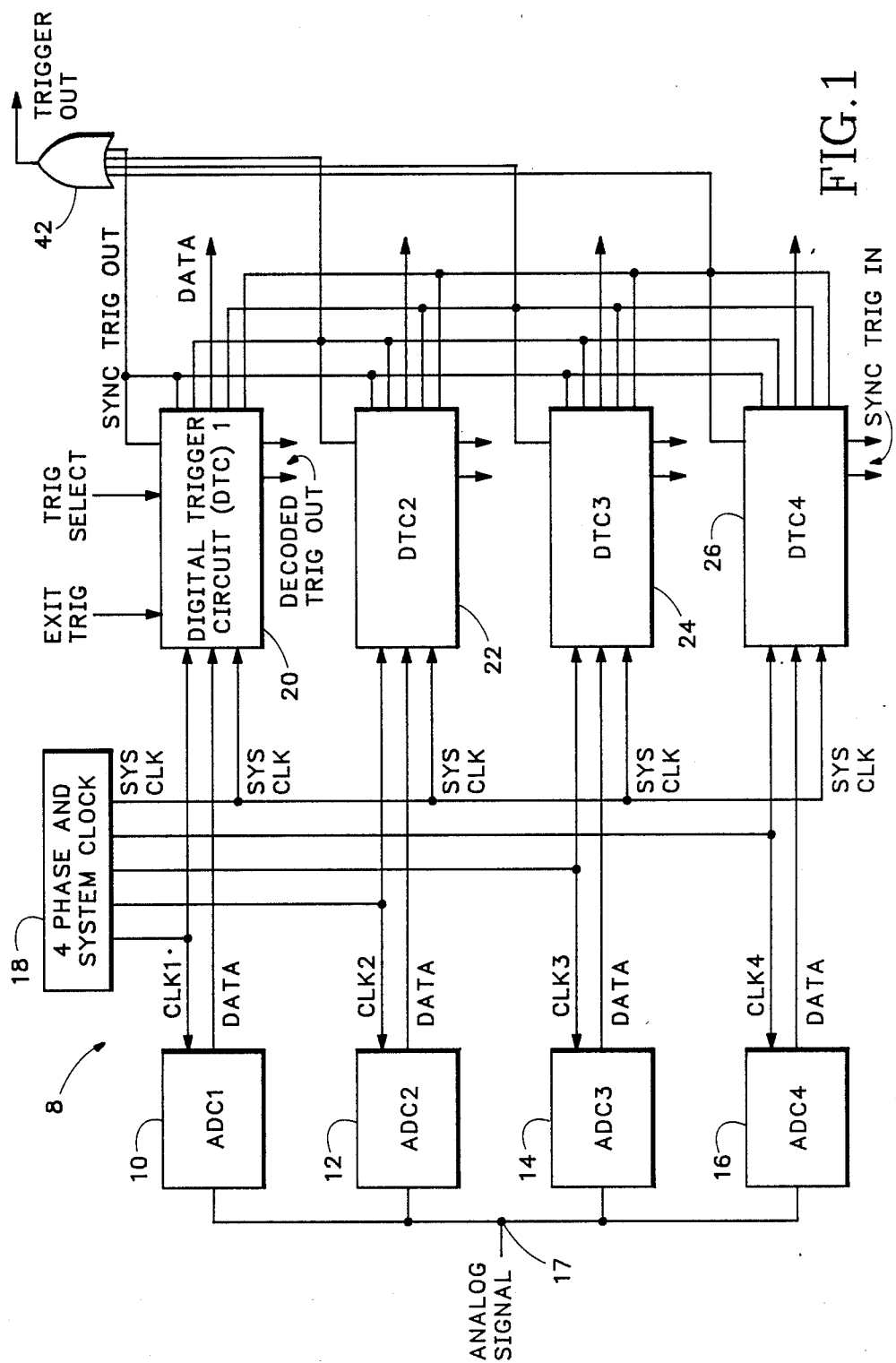
FIG. 1 is a block diagram showing the interconnection of digital triggers circuits with a multiphase clock and analog-to-digital converters according to the invention.
Figure 2:
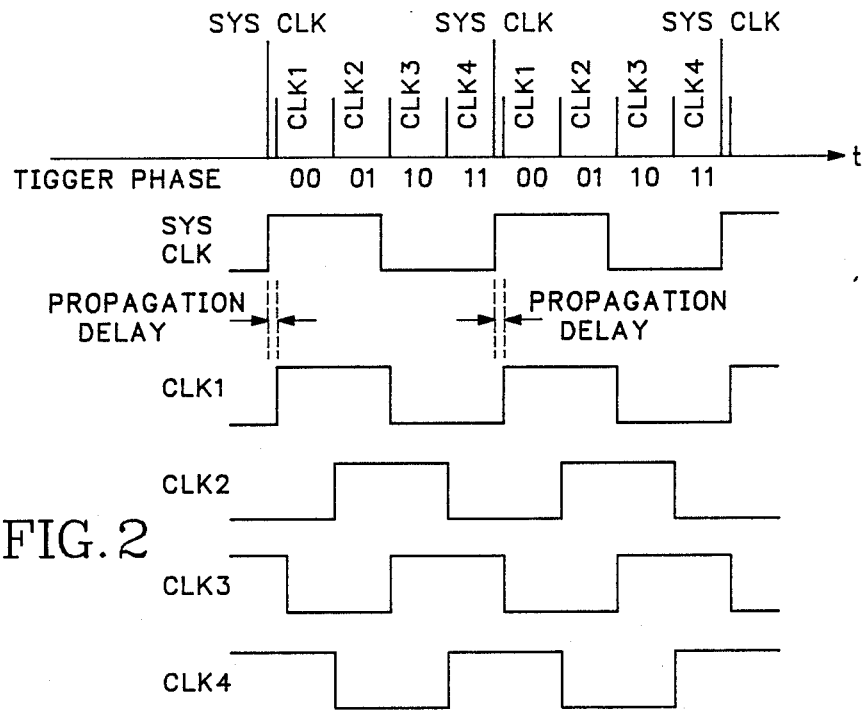
FIG. 2 is a timing diagram illustrating the relationship between the system clock and each of the individual clocks of the multiphase clock.

Referring now to FIG. 1, the input portion or "front end" 8 of a digitizing instrument such as a digital oscilloscope, transient digitizer, or equivalent instrument is shown. Such instruments are designed to capture an analog signal and digitally store the signal for analysis. The input portion includes a plurality of analog-to-digital converters (ADCs) 10, 12, 14, 16 whose inputs are all coupled together at a node 17 to receive an analog signal. A multiphase clock 18 is coupled to the strobe pin of each ADC to cause the ADCs to sample the analog signal on the rising edge of a clock pulse. As illustrated in FIG. 2, clock 18 has four separate clocks CLK1, CLK2, CLK3, and CLK4, each generating a clock pulse during a successive 90° phase of the multiphase clock period. A master synchronizing clock SYSCLK is also provided and acts as a system clock for the instrument as a whole. Referring again to FIG. 1, ADC 10 is clocked by the rising edge of CLK1; ADC 12 is clocked by the rising edge of CLK2; ADC 14 is clocked by the rising edge of CLK3, and ADC 16 is clocked by the rising edge of CLK4. Each of the analog-to-digital converters is thus clocked by a different clock so as to sample the analog signal during each phase of the clock period at a rate greater than the sampling rate of a single analog-to-digital converter. The system clock is generated slightly before the rising edge of CLK1 to allow the digitized output signal from each ADC to be stored before simultaneous comparison with the trigger threshold value, as will be further explained.

Upon receiving its clock signal, each of the above-identified ADCs generates an output signal comprising digital data representing a sample value of the analog input signal. The data is transmitted to a digital trigger circuit as shown in FIG. 1. ADC 10 transmits data to digital trigger circuit 20; ADC 12 transmits data to digital trigger circuit 22; ADC 14 transmits data to digital trigger circuit 24; and ADC 16 transmits data to digital trigger circuit 26. Each of the digital trigger circuits is also clocked by the associated ADC clock and the system clock signal SYSCLK. Other inputs to the digital trigger circuit include an external trigger signal and a trigger select signal. The latter signal enables the operator to select between external triggering and the presently described internal triggering.

Figure 3:
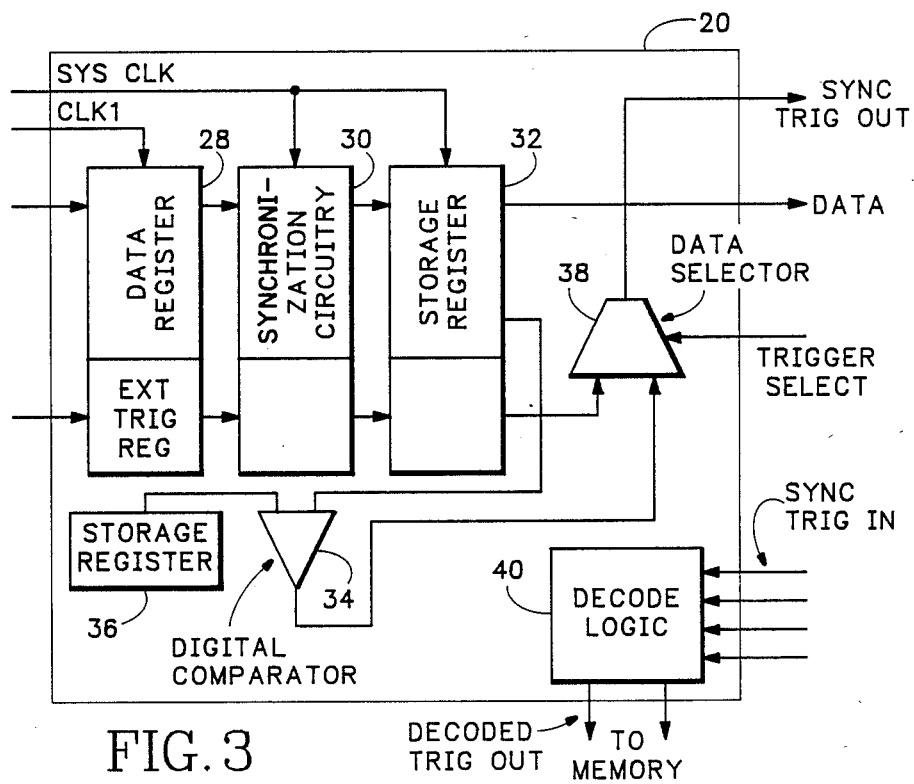
FIG. 3 is a schematic diagram of a digital trigger circuit according to the invention.

FIG. 3 is a schematic diagram of digital trigger circuit 20, which is identical to each of the other digital trigger circuits. Each digital trigger circuit is clocked by its respective clock to receive the data from a corresponding ADC. For example, the digital data from ADC 10 is clocked by CLK1 into a data register 28 within circuit 20 to be synchronized to the system clock. The digital data is stored in the data register 28 until the next system clock pulse, which clocks the data synchronization circuitry 30. The circuitry 30 in each digital trigger circuit assures that digital data generated in the same clock period is simultaneously clocked into a storage register 32 within each trigger circuit. These steps of storing the digital data on the separate clock signal and then synchronizing the data to the system clock signal occurs in each of the digital trigger circuits 20, 22, 24, and 26. On a system clock pulse following CLK4, the digital data from each ADC is synchronized and presented simultaneously in each digital trigger circuit for determining if a trigger point has occurred on the input signal during the sampling interval.

The digital data within register 32 is routed to means such as a digital comparator 34 for comparison with a digital threshold trigger level stored in storage register 36 by user control. The result of that comparison is routed through a data selector 38 as a SYNC TRIG signal. The data selector 38 is adapted to select between the internal trigger signal from digital comparator 34 and an external trigger. The selection is made via a trigger select signal from the instrument control panel (not shown).

To determine the phase of the sampling interval relative to the system clock, each of the SYNC TRIG signals of the collective comparators 34 are applied on the system clock signal to means for evaluating the comparator output signals. Such means ay comprise decode logic 40 located within each digital trigger circuit. Logic 40 generates a 2-bit output signal that indicates the phase of the clock period, referred to as the trigger phase in FIG. 3. For example, if a trigger signal first appeared at the output of digital trigger circuit 22, the 2-bit output signal would have a binary value of 01 as indicated in FIG. 2. This 2-bit signal is then latched in another register (not shown) to be read by a microprocessor for determining the trigger phase.

Referring again to FIG. 1, means for detecting if a trigger signal occurs during a clock period may comprise an OR gate 42. Each of the SYNC TRIG signals are routed to an input of OR gate 42, whose output is thus the trigger signal for the instrument, TRIGGER OUT. If a trigger signal is detected in the output signal of the OR gate, the 2-bit output signal of logic 40 is evaluated. If no trigger signal is detected, the 2-bit signal is ignored.

Having illustrated and described the principles of the invention in a preferred embodiment, it should be apparent to those skilled in the art that the invention can be modified in arrangement and detail without departing from such principles. I claim all modifications coming within the spirit and scope of the following claims.

I claim:

1. A digital trigger, comprising:
   a plurality of analog-to-digital converters for sampling an analog signal, each of said converters sampling the analog signal at a different phase of a clock period;
   comparator means for comparing the output signal of each analog-to-digital converter to a trigger threshold level to generate a trigger signal if a trigger point occurs on the output signal; and
   means for evaluating the output signals of the collective comparator means generated during the same clock period to determine the clock phase in which the trigger point occurred.

2. The digital trigger of claim 1 wherein the evaluating means comprises decoding logic coupled to the comparator means for generating a signal that indicates the phase of the clock period in which the trigger point occurred.

3. The digital trigger of claim 1 including a multiphase clock circuit having a plurality of clocks each clocking an analog-to-digital converter during a different phase of the multiphase clock period.

4. The digital trigger of claim 1 wherein the comparator means comprises
   a digital comparator for comparing the digitized value of a trigger threshold level against the digitized output signal of the analog-to-digital converter, the comparator generating a trigger signal if the digitized output signal exceeds the value of the trigger threshold level.

5. The digital circuit of claim 1 including means for detecting if a trigger signal occurred during a clock period.

6. A digital trigger for a digitizing instrument, comprising:
   a clock circuit having a plurality of separate clocks each generating a clock pulse during a different phase of a clock period and a system clock for generating a system clock signal defining the clock period;
   a plurality of analog-to-digital converters for sampling an analog signal, each of said converters clocked by the signal of a different clock so as to sample the analog signal during each phase of the clock period;
   a digital comparator for comparing the output signal of each analog-to-digital converter to a trigger threshold level to generate a trigger signal at the output of the comparator means if a trigger point occurs on the output signal;
   means for evaluating the output signals of the digital comparators to determine the clock phase in which a trigger point occurred; and
   means for detecting if a trigger point occurred during a clock period.

7. The digital trigger of claim 6 wherein the comparator means comprises:
   a data register for accepting the output signal of the analog-to-digital converter on the clock signal of the separate clock;
   synchronization circuitry clocked to receive the output signal from the data register on each clock signal of the system clock to synchronize the output signals of the analog-to-digital converters;
   a storage register clocked to receive the output signal from the synchronization circuitry on a clock signal of the system clock;
   and a digital comparator for comparing the digital value of a trigger threshold level against the output signal within the storage register, the comparator generating a trigger signal if the output signal exceeds the value of the trigger threshold level.

8. In a digitizing instrument wherein the instrument includes a plurality of analog-to-digital converters for sampling an analog signal, each of said converters sampling at a different phase of a clock period, a method of determining the phase of the clock period in which a trigger point occurs, comprising:

comparing the digital output signal of each analog-to-digital converter means against a trigger threshold level to generate a trigger signal if a trigger point occurs on the output signal; and evaluating the results of the above comparisons generated during a clock period to determine in which phase a trigger point occurred.

9. The method of claim 8 including synchronizing the output signals of the analog-to-digital converters before evaluation.

10. The method of claim 8 including logically ORing the results of the above comparisons to determine if a trigger point occurred during a clock period.

* * * * *